(12) United States Patent
Tanaka

(10) Patent No.: US 10,476,474 B2
(45) Date of Patent: Nov. 12, 2019

(54) ACOUSTIC WAVE RESONATOR, FILTER, AND DUPLEXER

(71) Applicant: TAIYO YUDEN CO., LTD., Tokyo (JP)

(72) Inventor: Tabito Tanaka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 123 days.

(21) Appl. No.: 15/341,716

(22) Filed: Nov. 2, 2016

(65) Prior Publication Data

US 2017/0201229 A1    Jul. 13, 2017

(30) Foreign Application Priority Data

Jan. 13, 2016  (JP) .................................. 2016-004617

(51) Int. Cl.
*H03H 9/145* (2006.01)
*H03H 9/02* (2006.01)
(Continued)

(52) U.S. Cl.
CPC .... *H03H 9/14532* (2013.01); *H03H 9/02818* (2013.01); *H03H 9/1457* (2013.01);
(Continued)

(58) Field of Classification Search
CPC .......... H03H 9/02535; H03H 9/02818; H03H 9/145; H03H 9/14532; H03H 9/14541;
(Continued)

(56) References Cited

U.S. PATENT DOCUMENTS 6,791,236 B1* 9/2004 Abramov ........... H03H 9/14505
310/313 B 7,576,471 B1* 8/2009 Solal .................. H03H 9/02858
310/313 B
(Continued)

FOREIGN PATENT DOCUMENTS

JP  58-143620 A   8/1983
JP  03-108808 A   5/1991
(Continued)

OTHER PUBLICATIONS

Japanese Office Action dated Feb. 20, 2018, in a counterpart Japanese patent application No. 2016-004617. (A machine translation (not reviewed for accuracy) attached.).

(Continued)

*Primary Examiner* — Barbara Summons
(74) *Attorney, Agent, or Firm* — Chen Yoshimura LLP

(57) ABSTRACT

An acoustic wave resonator includes: comb-shaped electrodes located on a piezoelectric substrate, each including electrode fingers exciting an acoustic wave and a bus bar electrode connecting to the electrode fingers, the comb-shaped electrodes forming an overlap region where the electrode fingers of one of the comb-shaped electrodes overlap the electrode fingers of the other, wherein each of the electrode fingers overlapping in the comb-shaped electrodes includes: a first region that is located in the overlap region, where a velocity of the acoustic wave is a first velocity, and of which a position in a first direction in which the electrode fingers extend changes with respect to a second direction intersecting the first direction; and second regions that are located in the overlap region, where a velocity of the acoustic wave is a second velocity different from the first velocity, and that sandwich the first region in the first direction.

16 Claims, 21 Drawing Sheets

(51) Int. Cl.
H03H 9/25 (2006.01)
H03H 9/64 (2006.01)
H03H 9/72 (2006.01)

(52) U.S. Cl.
CPC .......... H03H 9/14541 (2013.01); H03H 9/25 (2013.01); H03H 9/6433 (2013.01); H03H 9/725 (2013.01)

(58) Field of Classification Search
CPC .. H03H 9/1457; H03H 9/14576; H03H 9/171; H03H 9/25; H03H 9/54; H03H 9/64; H03H 9/6433; H03H 9/6483; H03H 9/70; H03H 9/725
USPC .......... 333/193–196, 133; 310/313 B, 313 C, 310/313 D
See application file for complete search history.

(56) References Cited

U.S. PATENT DOCUMENTS

| | | | |
|---|---|---|---|
| 8,294,331 B2* | 10/2012 | Abbott | H03H 9/02858 29/25.35 |
| 2011/0204994 A1 | 8/2011 | Matsuda et al. | |
| 2012/0068787 A1 | 3/2012 | Takata | |
| 2012/0161577 A1 | 6/2012 | Abbott et al. | |
| 2013/0051588 A1* | 2/2013 | Ruile | H03H 3/08 381/190 |
| 2013/0249647 A1 | 9/2013 | Nakanishi et al. | |
| 2014/0001919 A1* | 1/2014 | Komatsu | H03H 9/02818 310/313 B |
| 2014/0285287 A1* | 9/2014 | Komatsu | H03H 9/25 333/195 |
| 2017/0077902 A1 | 3/2017 | Daimon | |

FOREIGN PATENT DOCUMENTS

| | | | |
|---|---|---|---|
| JP | 03-158014 | * | 7/1991 |
| JP | H07-226643 A | | 8/1995 |
| JP | S60-241313 A | | 11/1995 |
| JP | 11-112274 | * | 4/1999 |
| JP | H11-251860 | | 9/1999 |
| JP | 2001-267880 A | | 9/2001 |
| JP | 2007-096527 | * | 4/2007 |
| JP | 2007-124439 A | | 5/2007 |
| JP | 2009-290472 | * | 12/2009 |
| JP | 2010-166148 A | | 7/2010 |
| JP | 2012-34082 A | | 2/2012 |
| JP | 2012-186808 A | | 9/2012 |
| JP | 2012-253738 A | | 12/2012 |
| JP | 2013-544041 A | | 12/2013 |
| WO | 2009/066367 A1 | | 5/2009 |
| WO | 2010/140456 A1 | | 12/2010 |
| WO | 2015/182521 A1 | | 12/2015 |

OTHER PUBLICATIONS

Japanese Office Action dated Aug. 7, 2018, in a counterpart Japanese patent application No. 2016-004617. (A machine translation (not reviewed for accuracy) attached.)

Japanese Office Action dated Mar. 5, 2019, in a counterpart Japanese patent application No. 2016-004617. (A machine translation (not reviewed for accuracy) attached.).

* cited by examiner

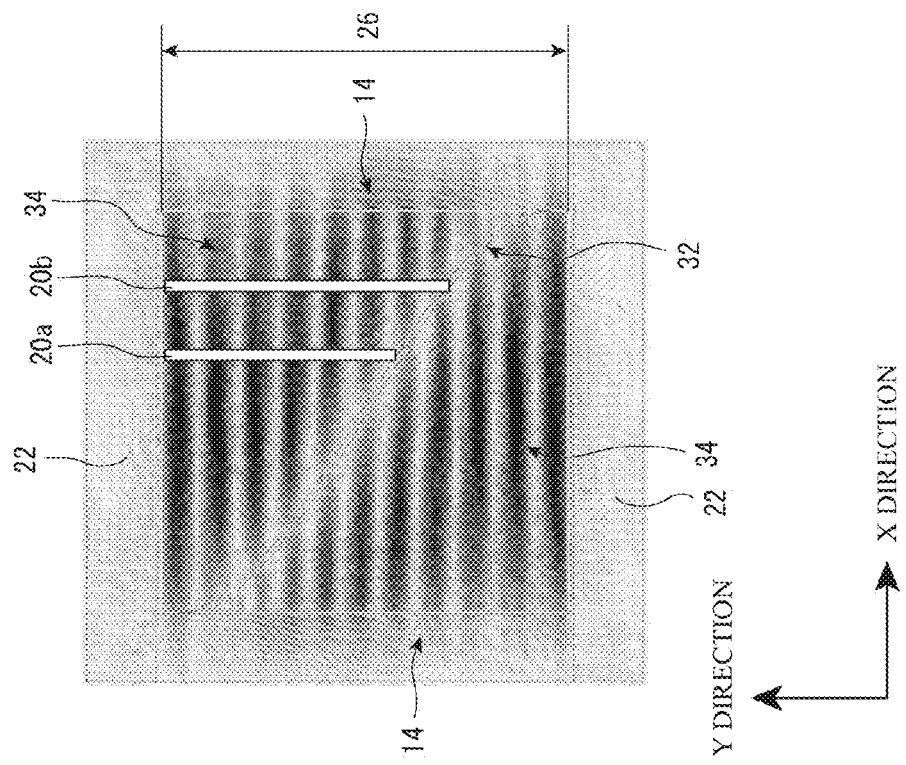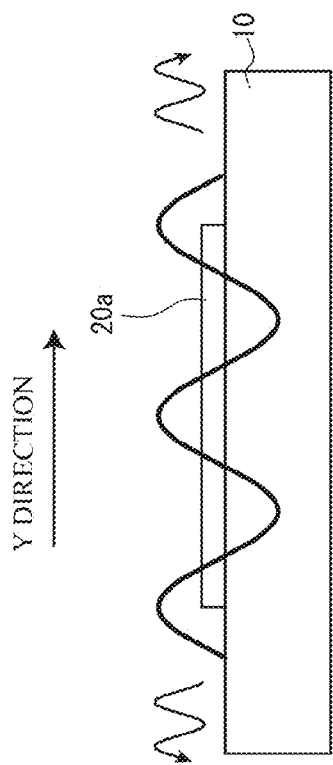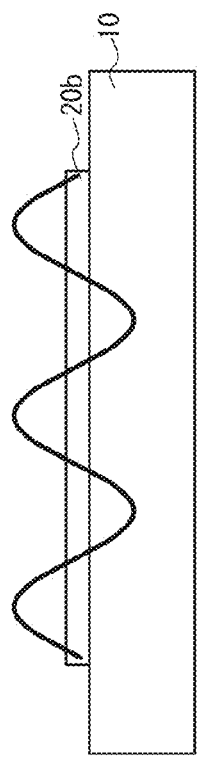

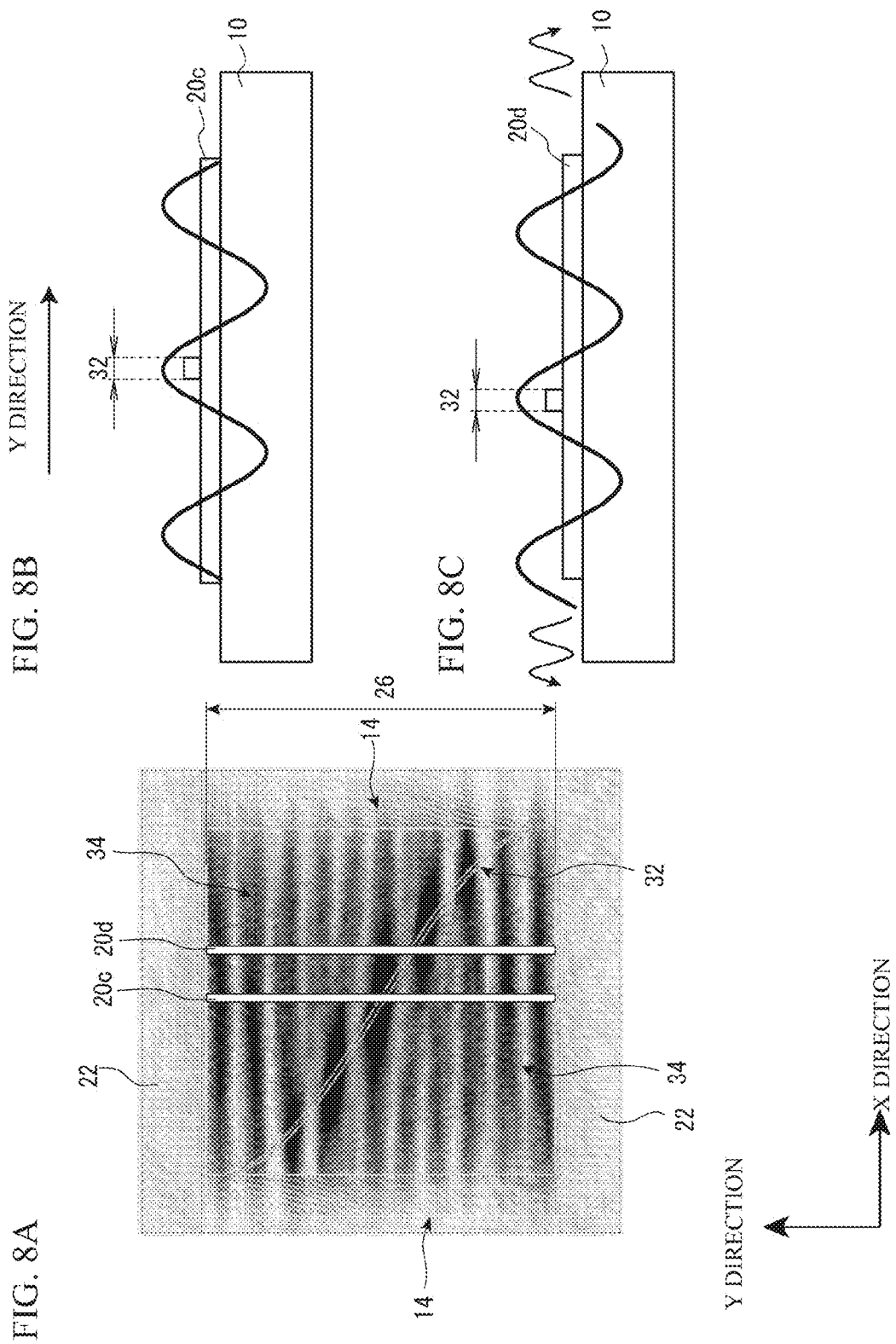

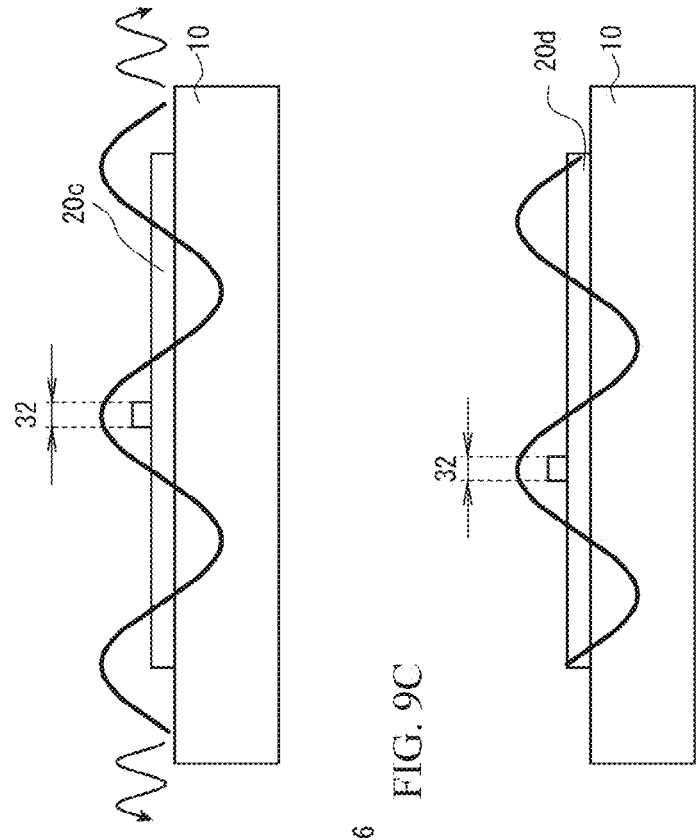
FIG. 9A
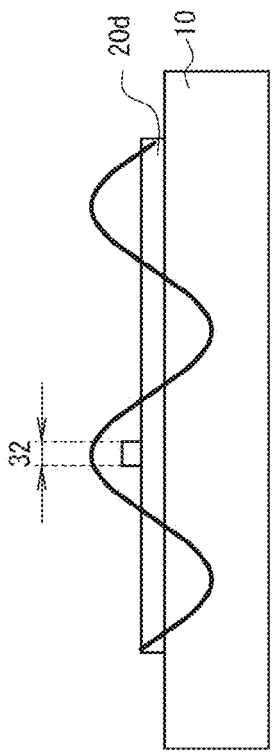
FIG. 9B
FIG. 9C

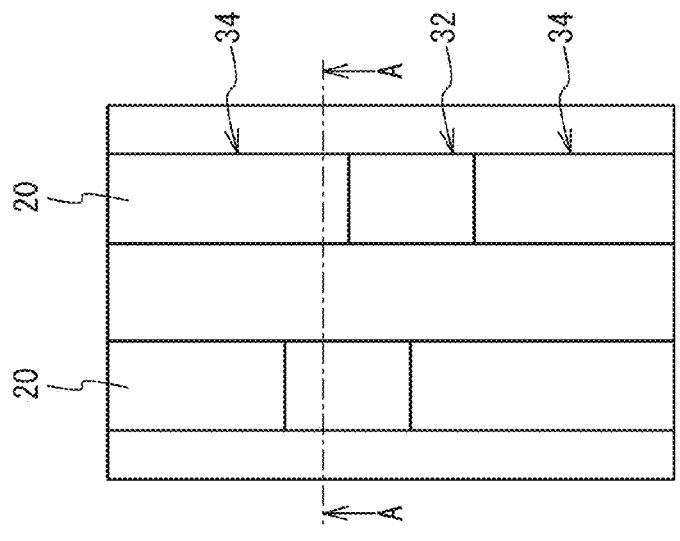
FIG. 11A
FIG. 11B
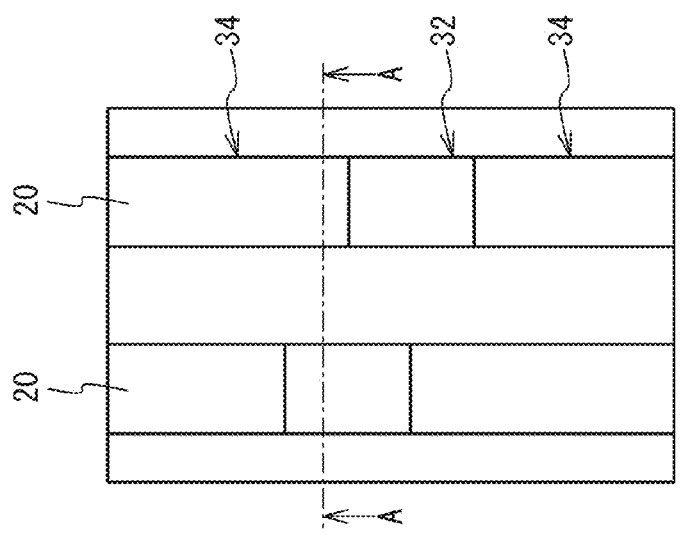
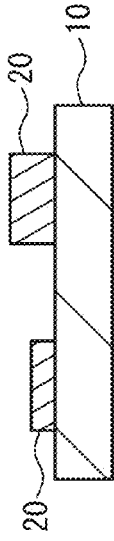
FIG. 11C
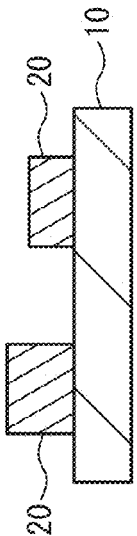
FIG. 11D

ACOUSTIC WAVE RESONATOR, FILTER, AND DUPLEXER

CROSS-REFERENCE TO RELATED APPLICATION

This application is based upon and claims the benefit of priority of the prior Japanese Patent Application No. 2016-004617, filed on Jan. 13, 2016, the entire contents of which are incorporated herein by reference.

Field

A certain aspect of the present invention relates to an acoustic wave resonator, a filter, and a duplexer.

Background

There have been known acoustic wave resonators that include electrode fingers, which excite an acoustic wave, located on a piezoelectric substrate and use a surface acoustic wave propagating through the surface of the piezoelectric substrate. The acoustic wave resonator is small and light, and exhibits large attenuation to signals outside a predetermined frequency band, therefore being used as a filter and a duplexer of a wireless communication device such as, for example, a mobile phone terminal.

In the acoustic wave resonator, an acoustic wave in a primary mode propagates in the width direction of the electrode finger, and an acoustic wave also propagates in the length direction of the electrode finger. The acoustic wave propagating in the length direction of the electrode finger causes lateral-mode spurious to occur in frequency characteristics. As a technique for reducing the lateral-mode spurious, there has been known a technique that changes an overlap width of the electrode fingers by providing dummy electrode fingers as disclosed in, for example, Japanese Patent Application Publication No. 58-143620. In addition to the technique that changes the overlap width of the electrode fingers, there has been also known a technique that makes a ratio of the area of the electrodes to the area of the whole region in which the electrodes are located in a non-overlap region greater than that in the overlap region, or a technique that provides a film that covers at least a part of the electrode finger and at least a part of the dummy electrode finger and of which the end face is tilted to the propagation direction of the acoustic wave in the primary mode as disclosed in, for example, International Publication No. 2010/140456 and Japanese Patent Application Publication No. 2010-166148.

However, in the technique that changes the overlap width of the electrode fingers, the overlap region in which the electrode fingers of a pair of comb-shaped electrodes overlap has a substantial diamond shape. Thus, the region of the electrode fingers that do not propagate the acoustic wave is large. Therefore, compared to the overlap region with a rectangular shape, the size of the electrode for achieving the same electrostatic capacitance is large.

SUMMARY OF THE INVENTION

According to a first aspect of the present invention, there is provided an acoustic wave resonator including: a piezoelectric substrate; a pair of comb-shaped electrodes located on the piezoelectric substrate, each of the pair of comb-shaped electrodes including a plurality of electrode fingers exciting an acoustic wave and a bus bar electrode to which the plurality of electrode fingers are connected, the pair of comb-shaped electrodes forming an overlap region in which the plurality of electrode fingers of one of the pair of comb-shaped electrodes and the plurality of electrode fingers of another of the pair of comb-shaped electrodes overlap, wherein each of the plurality of electrode fingers overlapping in the pair of comb-shaped electrodes includes: a first region that is located in the overlap region, in which a velocity of the acoustic wave is a first velocity, and of which a position in a first direction in which the plurality of electrode fingers extend changes with respect to a second direction intersecting the first direction; and second regions that are located in the overlap region, in which a velocity of the acoustic wave is a second velocity different from the first velocity, and that sandwich the first region in the first direction.

According to a second aspect of the present invention, there is provided a filter including: the above piezoelectric thin film resonator.

According to a third aspect of the present invention, there is provided a duplexer including: the above filter.

BRIEF DESCRIPTION OF THE DRAWINGS

FIG. 7A through FIG. 7C are diagrams (No. 1) for describing how spurious is reduced in the acoustic wave resonator of the first embodiment;

FIG. 8A through FIG. 8C are diagrams (No. 2) for describing how spurious is reduced in the acoustic wave resonator of the first embodiment;

FIG. 9A through FIG. 9C are diagrams (No. 3) for describing how spurious is reduced in the acoustic wave resonator of the first embodiment;

FIG. 11A through FIG. 11D illustrate a second technique for forming the first region and the second region between which the velocity of the acoustic wave therein differs;

DETAILED DESCRIPTION

Hereinafter, embodiments of the present invention will be described with reference to the accompanying drawings.

First Embodiment

Figure 1A:
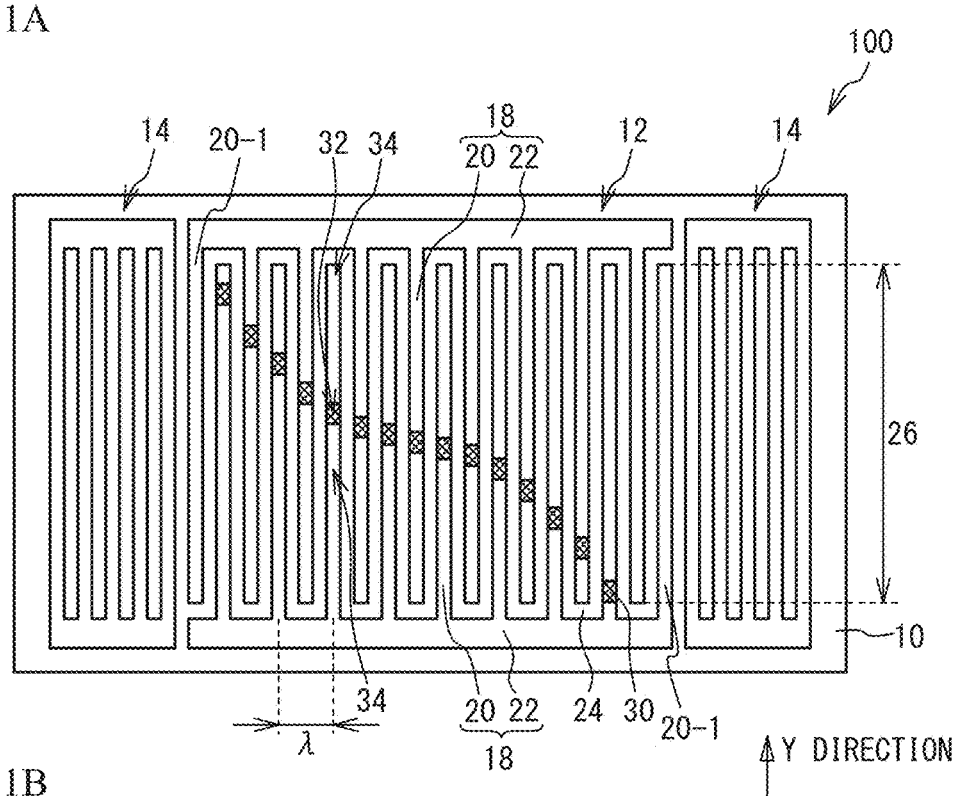
FIG. 1A is a plan view of an acoustic wave resonator in accordance with a first embodiment.
Figure 1B:
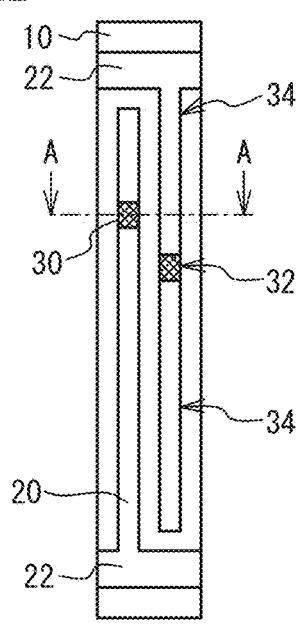
FIG. 1B is an enlarged view of a part of FIG. 1A.
Figure 1C:
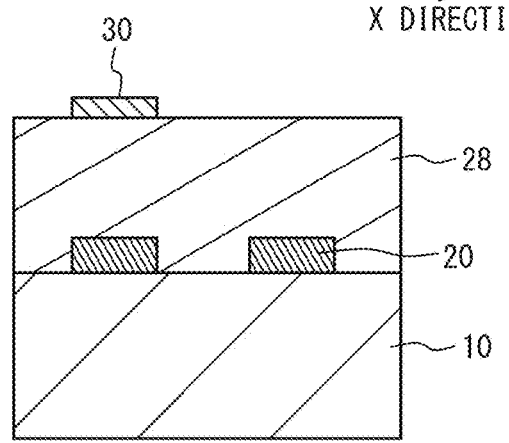
FIG. 1C is a cross-sectional view taken along line A-A in FIG. 1B.

FIG. 1A is a plan view of an acoustic wave resonator 100 in accordance with a first embodiment, FIG. 1B is an enlarged view of a part of FIG. 1A, and FIG. 1C is a cross-sectional view taken along line A-A in FIG. 1B. FIG. 1A and FIG. 1B omit the illustration of a dielectric film 28. As illustrated in FIG. 1A through FIG. 1C, the acoustic wave resonator 100 of the first embodiment includes an Interdigital Transducer (IDT) 12 and reflectors 14 located on a piezoelectric substrate 10. The piezoelectric substrate 10 is, for example, a lithium niobate substrate or a lithium tantalate substrate. The IDT 12 and the reflectors 14 are formed of a metal film.

The IDT 12 includes a pair of comb-shaped electrodes 18 facing each other. Each of the pair of comb-shaped electrodes 18 includes a plurality of electrode fingers 20 and a bus bar electrode 22 to which the electrode fingers 20 are connected. The comb-shaped electrodes 18 face each other so that the electrode fingers 20 of one of the comb-shaped electrodes 18 and the electrode fingers 20 of the other are arranged substantially alternately. A region between a tip of each of the electrode fingers 20 of one of the comb-shaped electrodes 18 and the bus bar electrode 22 of the other of the comb-shaped electrodes 18 is a gap region 24.

A region in which the electrode fingers 20 of one of the comb-shaped electrodes 18 and the electrode fingers 20 of the other overlap is an overlap region 26. In the overlap region 26, the acoustic wave excited by the electrode fingers 20 mainly propagates in a direction in which the electrode fingers 20 are aligned. That is, when the propagation direction of the acoustic wave is defined as an X direction, and a direction in which the electrode fingers 20 extend is defined as a Y direction, the electrode fingers 20 are aligned in the X direction. The pitch λ of the electrode fingers 20 is approximately the wavelength of the acoustic wave. The X direction and the Y direction do not necessarily correspond to the X-axis direction and the Y-axis direction of the crystal orientation of the piezoelectric substrate 10.

The dielectric film 28 is located so as to cover the IDT 12 and the reflectors 14. The dielectric film 28 is made of, for example, a silicon dioxide film. The silicon dioxide film has a temperature coefficient of an elastic constant opposite in sign to the temperature coefficient of the elastic constant of the piezoelectric substrate 10. Thus, the provision of the dielectric film 28 covering the IDT 12 can improve a temperature characteristic. The dielectric film 28 is not limited to a silicon dioxide film, and may be a film mainly composed of silicon oxide such as a silicon oxide film doped with another element such as, for example, fluorine. Even this configuration can improve the temperature characteristic. The dielectric film 28 may not be necessarily a dielectric film having a temperature coefficient of an elastic constant opposite in sign to the temperature coefficient of the elastic constant of the piezoelectric substrate 10.

A dielectric film 30 made of a material different from the material of the dielectric film 28 is formed on the dielectric film 28 in a part of each of the electrode fingers 20 in the overlap region 26. The dielectric film 30 is made of, for example, an aluminum oxide film. The length of the dielectric film 30 in the Y direction is, for example, 1 µm or greater and 5λ or less. In the electrode fingers 20, a region in which the dielectric film 30 is located above the electrode finger 20 is defined as a first region 32, and a region in which the dielectric film 30 is not located is defined as a second region 34. The second regions 34 sandwich the first region 32 in the Y direction. The velocity of the acoustic wave in the first region 32 (a first velocity) differs from the velocity of the acoustic wave in the second region 34 (a second velocity) because the dielectric film 30 is located above the electrode finger 20 in the first region 32. For example, when the dielectric film 30 is made of an aluminum oxide film, the first velocity of the acoustic wave in the first region 32 is faster than the second velocity of the acoustic wave in the second region 34. In the pair of comb-shaped electrodes 18, the positions of the first regions 32 of the electrode fingers 20 in the Y direction change in a curved line with respect to the X direction. The velocity of the acoustic wave compared between the first region 32 and the second region 34 may be the velocity of the acoustic wave propagating in the X direction or the velocity of the acoustic wave propagating in the Y direction. The velocity of the acoustic wave propagating in the X direction bears a proportionate relationship to the velocity of the acoustic wave propagating in the Y direction. At least one of the pair of comb-shaped electrodes 18 may include an electrode finger 20-1 formed of a region in which the velocity of the acoustic wave is the second velocity in the overlap region 26.

Figure 2A:
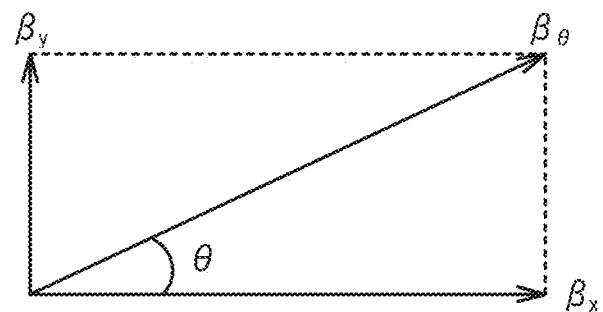
FIG. 2A is a plan view of wave numbers in an X direction and a Y direction.
Figure 2B:
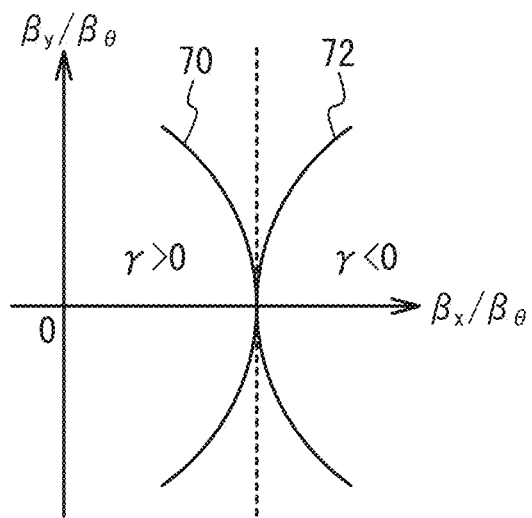
FIG. 2B illustrates $\beta_y/\beta_\theta$ with respect to $\beta_x/\beta_\theta$.

Here, an anisotropy coefficient will be described. FIG. 2A is a plan view of wave numbers in the X direction and the Y direction, and FIG. 2B illustrates $\beta_y/\beta_\theta$ with respect to $\beta_x/\beta_\theta$. As illustrated in FIG. 2A, the wave number of the acoustic wave in the X direction is represented by $\beta_x$, and the wave number of the acoustic wave in the Y direction is represented by $\beta_y$. When the wave number $\beta_\theta$ of the acoustic wave in a direction at an angle θ from the X direction to the Y direction is assumed to be approximated by a parabola, the wave number $\beta_\theta$ is expressed by the equation $\beta_\theta^2 = \beta_x^2 + \gamma \cdot \beta_y^2$ with an anisotropy coefficient γ.

As illustrated in FIG. 2B, $\beta_x/\beta_\theta$ corresponds to the slowness of the phase velocity of the acoustic wave in the X direction, and $\beta_y/\beta_\theta$ corresponds to the slowness of the phase velocity of the acoustic wave in the Y direction. When the anisotropy coefficient γ is positive, a slowness surface 70 has a convex shape as viewed from the origin. Thus, the state of γ>0 is also called a convex state. When the anisotropy coefficient γ is negative, a slowness surface 72 has a concave shape as viewed from the origin. Thus, the state of γ<0 is also called a concave shape.

The anisotropy coefficient γ is determined by the material of the piezoelectric substrate 10 and the material, the film thickness, and the pitch of the electrode fingers 20. For example, when the piezoelectric substrate 10 is a rotated Y-cut X-propagation lithium niobate substrate, the anisotropy coefficient γ is positive. When the piezoelectric substrate 10 is a rotated Y-cut X-propagation lithium tantalate substrate, the anisotropy coefficient γ is negative. When a rotated Y-cut X-propagation lithium tantalate substrate is used, the electrode fingers 20 are made of a heavy material, and the film thickness of the electrode finger 20 is increased, the anisotropy coefficient γ may become positive. For example, assume that metal films are stacked as the electrode fingers 20, and that the density of each metal film of the metal films is represented by ρi, the Poisson ration of each metal film is represented by Pi, the film thickness of each metal film is represented by hi, the density of copper is represented by ρ0, the Poisson ratio of copper is represented by P0, and the pitch is represented by λ. In this case, when the sum obtained by adding up (hi/λ)×(ρi/ρ0)×(Pi/P0) of each metal film is greater than 0.08, the anisotropy coefficient γ can be made to be positive as an acoustic wave resonator even when the piezoelectric substrate 10 is a rotated Y-cut X-propagation lithium tantalate substrate.

For example, when the electrode fingers 20 are formed of mainly Cu, and h/λ is 0.08 or greater, the anisotropy coefficient γ is positive. When the electrode fingers 20 are formed of mainly tungsten (W), and h/λ is 0.05 or greater, the anisotropy coefficient γ is positive. When the electrode fingers 20 are formed of mainly Ru, and h/λ is greater than 0.07, the anisotropy coefficient γ is positive. When the electrode fingers 20 are formed of mainly molybdenum (Mo), and h/λ is greater than 0.08, the anisotropy coefficient γ is positive. When the electrode fingers 20 are formed of mainly aluminum (Al), and h/λ is 0.15 or greater, the anisotropy coefficient γ is positive. When the electrode fingers 20 are formed of mainly Ti, and h/λ is 0.125 or greater, the anisotropy coefficient γ is positive.

Next, simulations conducted by the inventors will be described. The inventors conducted a simulation for measuring the conductance characteristic on the acoustic wave resonator 100 of the first embodiment. The simulation was conducted on the acoustic wave resonator 100 configured as follows. The piezoelectric substrate 10 is a 128° Y-cut X-propagation lithium niobate substrate. The IDT 12 and the reflectors 14 are made of a multilayered metal film formed of Ti with a thickness of 26 nm, Cu with a thickness of 252 nm, and Cr with a thickness of 9 nm. The dielectric film 28 is formed of a silicon dioxide film with a thickness of 1150 nm on the electrode. The dielectric film 30 is made of an aluminum oxide film with a thickness of 70 nm and a length in the Y direction of 7.8 μm. The pitch λ is 3.9 μm, the duty ratio is 50%, the number of pairs of the electrode fingers of the IDT is 60 pairs, and the overlap width (the length of the overlap region 26) is 234 μm. For comparison, simulated was the conductance characteristic of an acoustic wave resonator of a first comparative example that has the same configuration as the above configuration except that the dielectric film 30 is not located. In the simulation, the anisotropy coefficient γ is positive both in the first embodiment and the first comparative example, and the velocity V1 of the acoustic wave in the first region 32 is greater than the velocity V2 of the acoustic wave in the second region 34 in the first embodiment.

Figure 3:
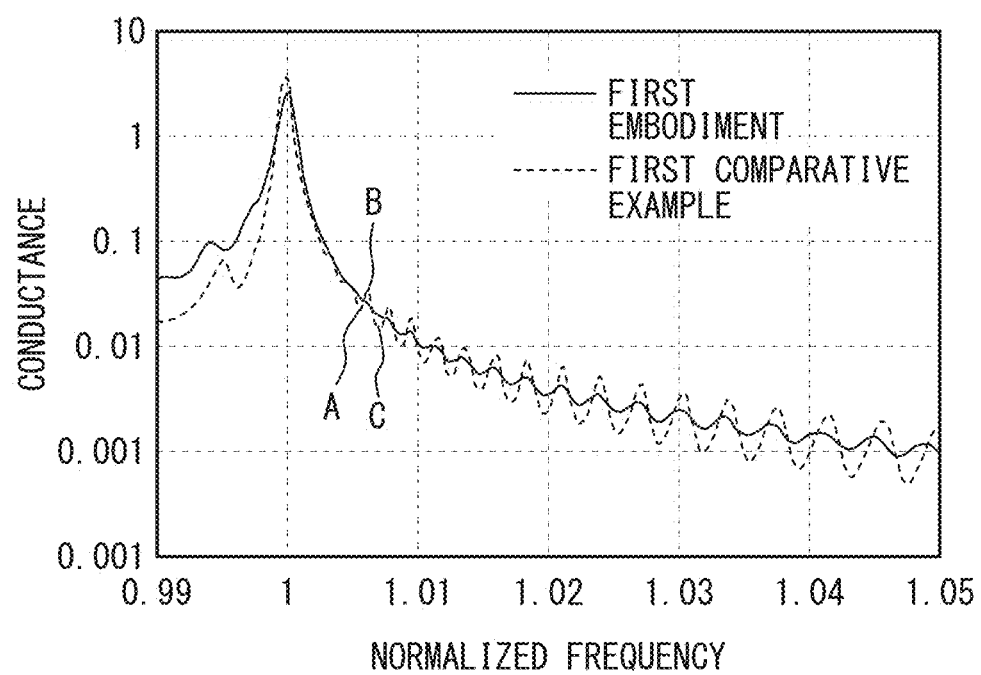
FIG. 3 illustrates simulation results of conductance characteristics in acoustic wave resonators of the first embodiment and a first comparative example.

FIG. 3 illustrates simulation results of conductance characteristics in the acoustic wave resonator 100 of the first embodiment and the acoustic wave resonator of the first comparative example. The horizontal axis in FIG. 3 represents a normalized frequency obtained by dividing a frequency by a resonant frequency. The vertical axis represents conductance. As illustrated in FIG. 3, the first embodiment reduces spurious compared to the first comparative example.

Figure 4A:
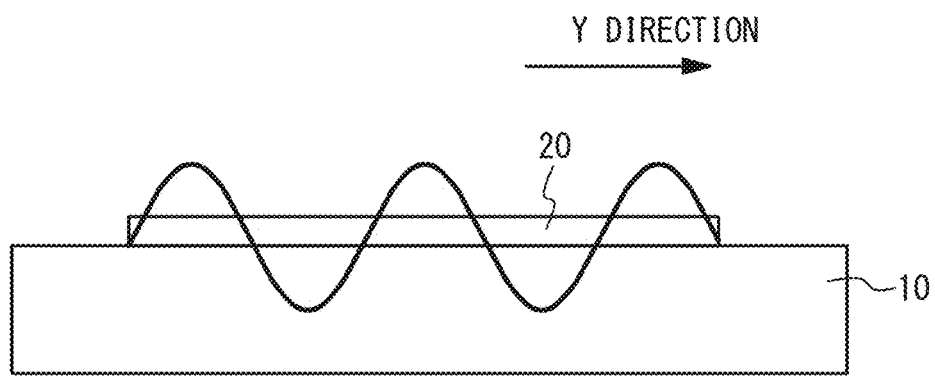
FIG. 4A and FIG. 4B are diagrams for describing how spurious becomes large in the acoustic wave resonator of the first comparative example.
Figure 4B:
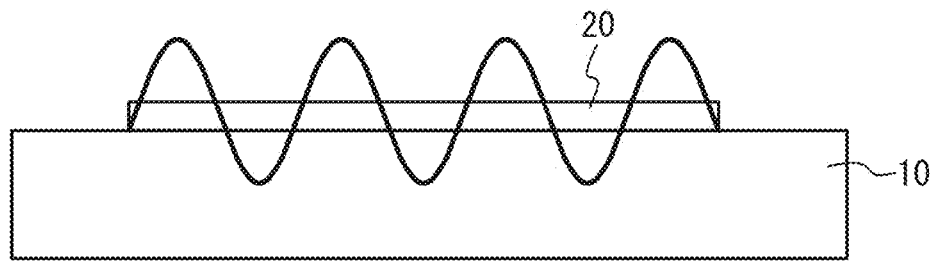

Before the reason why spurious is reduced in the first embodiment is described, the reason why spurious becomes large in the first comparative example will be described. FIG. 4A and FIG. 4B are diagrams for describing how spurious becomes large in the acoustic wave resonator of the first comparative example. FIG. 4A illustrates the waveform of a wave propagating through the electrode finger 20 extending in the Y direction in the overlap region 26 at a first frequency f1. FIG. 4B illustrates the waveform of a wave propagating through the electrode finger 20 extending in the Y direction in the overlap region 26 at a second frequency f2. The second frequency f2 is higher than the first frequency f1.

In the first comparative example, the electrode fingers 20 are uniformly covered with the dielectric film 28 in the overlap region 26, and the dielectric film 30 is not located. Thus, the velocity Vi of the acoustic wave propagating through the electrode finger 20 in the Y direction is approximately the same across the overlap region 26. The velocity Vi of the acoustic wave is faster than the velocity Vg of the acoustic wave propagating through the gap region 24. When the anisotropy coefficient γ is positive and Vi is less than Vg (Vi<Vg), the wave propagating in the Y direction has difficulty in leaking from the overlap region 26 to the outside.

In the above-described state, as illustrated in FIG. 4A and FIG. 4B, at the first frequency f1 and the second frequency f2, the antinode lies in the middle of the electrode finger 20 in the Y direction in the overlap region 26, and the nodes lie at the ends of the electrode finger 20 in the Y direction. In this case, the acoustic wave propagating in the Y direction does not leak from the overlap region 26 to the outside, and is reflected in the Y direction in the overlap region 26. That is, a stationary wave is generated.

In contrast, at a third frequency f3 between the first frequency f1 and the second frequency f2, the state transitioning from the state illustrated in FIG. 4A to the state illustrated in FIG. 4B is caused, and the nodes do not lie at the ends of the electrode finger 20 in the Y direction in the overlap region 26. In this case, the acoustic wave propagating in the Y direction leaks from the overlap region 26 to the outside. That is, a stationary wave is not generated.

Figure 5:
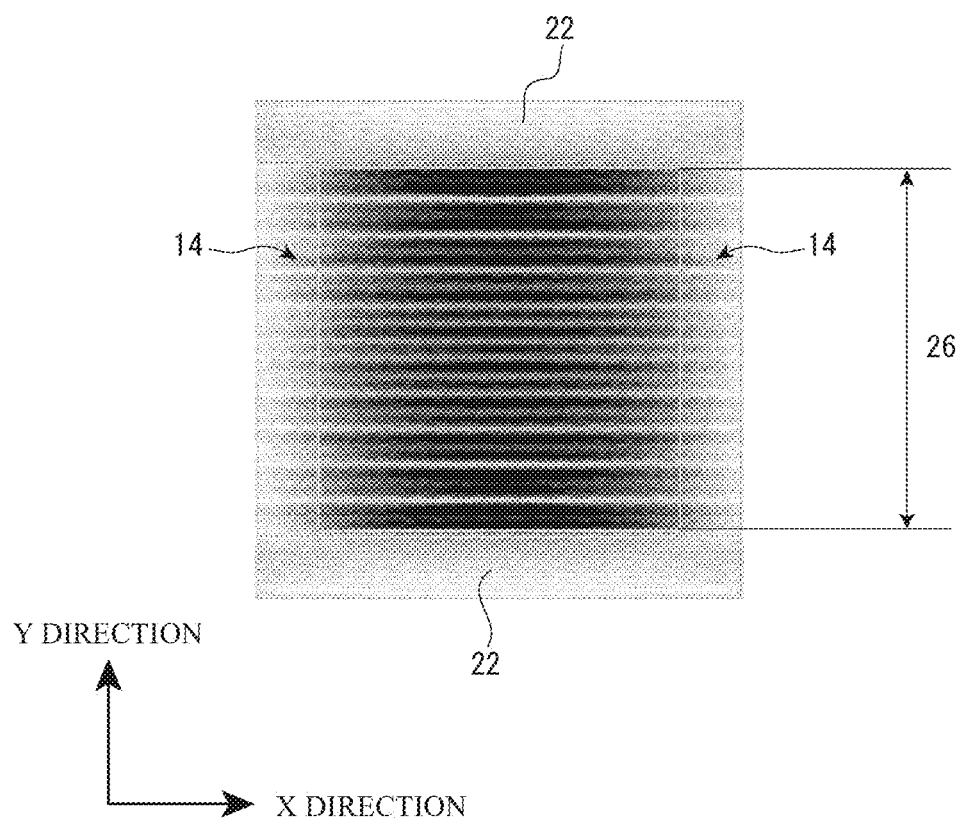
FIG. 5 illustrates simulation results of wave distribution at a frequency at which spurious occurs in the acoustic wave resonator of the first comparative example.

In the first comparative example, as described above, the electrode fingers 20 in the overlap region 26 are uniformly covered with the dielectric film 28, and the dielectric film 30 is not located. Accordingly, in the electrode fingers 20 aligned in the X direction, the waveforms of waves generated in the Y direction become the same. FIG. 5 illustrates simulation results of wave distribution at a frequency at which spurious occurs in the acoustic wave resonator of the first comparative example. In FIG. 5, black areas in the overlap region 26 correspond to the positions of antinodes, and white areas correspond to the positions of nodes. FIG. 5 also reveals that in the first comparative example, the positions of the nodes and antinodes of the waves generated in the Y direction are the same in the X direction. The above described phenomena cause the acoustic wave propagating in the Y direction not to leak to the outside in the electrode fingers 20 aligned in the X direction at the first frequency f1 and the second frequency f2, and cause the wave propagating in the Y direction to leak to the outside in the electrode fingers 20 aligned in the X direction at the third frequency f3. That is, at the first frequency f1 and the second frequency f2, the leakage of the wave to the outside is small, while at the third frequency f3, the leakage of the wave to the outside is large. This is considered the reason why spurious becomes large in the first comparative example.

Figure 6A:
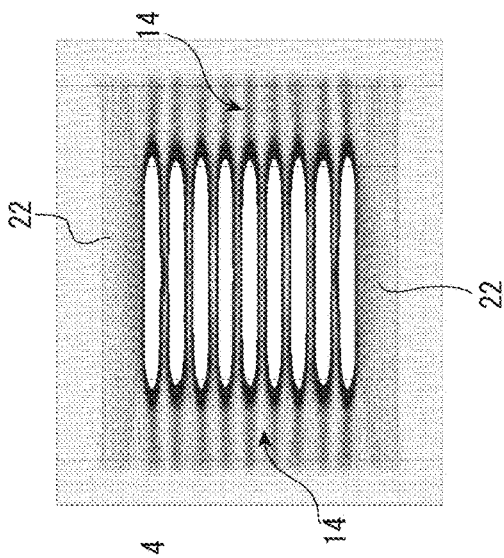
FIG. 6A through FIG. 6C illustrate simulation results of wave distributions at frequencies indicated by A, B, and C in FIG. 3, respectively.
Figure 6B:
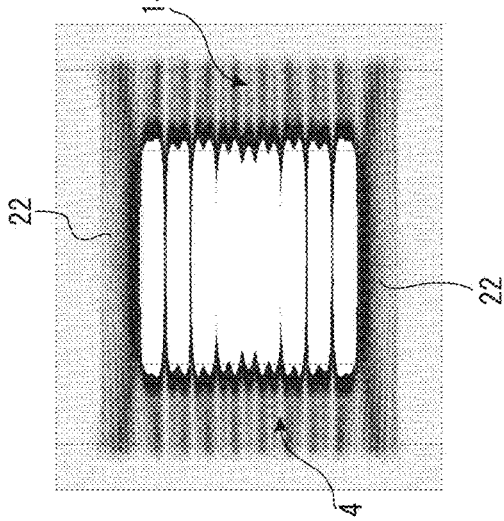
Figure 6C:
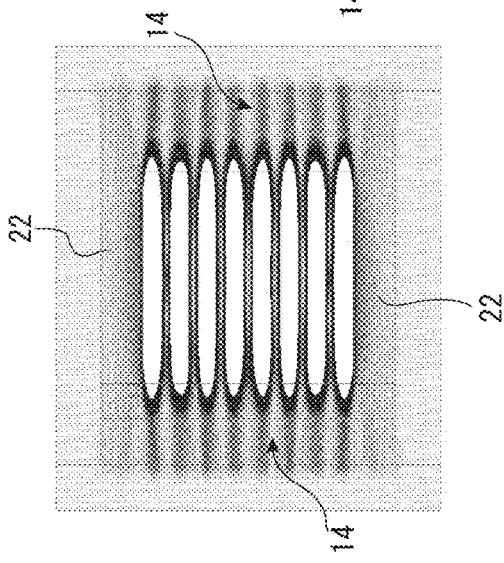

FIG. 6A through FIG. 6C illustrate simulation results of wave distributions at frequencies indicated by A through C in FIG. 3, respectively. In FIG. 6A through FIG. 6C, the area in which the amplitude of the wave is greater than a predetermined value is represented by white so that the position of the antinode in which the amplitude is relatively small (black area) can be identified. FIG. 3 and FIG. 6B reveal that at a frequency indicated by B, many waves leak to the bus bar electrode 22. In contrast, FIG. 3, FIG. 6A, and FIG. 6C reveal that at frequencies indicated by A and C, waves do not leak to the bus bar electrode 22 much. These results also reveal that there are frequencies at which the leakage of the wave propagating in the Y direction to the outside is large in the electrode fingers 20 aligned in the X direction and frequencies at which the leakage is small, and this makes spurious large.

FIG. 7A through FIG. 7C are diagrams for describing how spurious is reduced in the acoustic wave resonator 100 of the first embodiment. FIG. 7A illustrates a simulation result of wave distribution at a frequency at which spurious occurs. Black areas in the overlap region 26 correspond to the positions of antinodes, and white areas correspond to the positions of nodes. FIG. 7B illustrates the waveform of a wave propagating through the second region 34 of a first electrode finger 20a included in the electrode fingers 20 at a predetermined frequency f, and FIG. 7C illustrates the waveform of a wave propagating through the second region 34 of a second electrode finger 20b included in the electrode fingers 20 at the predetermined frequency f.

In the first embodiment, each of the electrode fingers 20 includes the first region 32 in which the velocity of the acoustic wave is V1 and the second regions 34 that are located at both sides of the first region 32 and in which the velocity of the acoustic wave is V2 less than V1. Since the anisotropy coefficient γ is positive and V1 is greater than V2, the wave propagating in the Y direction is in a state where the wave has difficulty in leaking from the second region 34 to the outside. In addition, since the positions of the first regions 32 in the Y direction change with respect to the X direction, the length of the second region 34 of the first electrode finger 20a in the Y direction differs from the length of the second region 34 of the second electrode finger 20b in the Y direction. That is, the overlap width in the second region 34 differs between the first electrode finger 20a and the second electrode finger 20b. Accordingly, at the predetermined frequency f, in the first electrode finger 20a, the node does not lie at the ends of the first electrode finger 20a as illustrated in FIG. 7B, while in the second electrode finger 20b, the nodes lie at the ends of the second electrode finger 20b as illustrated in FIG. 7C. In FIG. 7B, the wave propagating in the Y direction leaks from the second region 34 to the outside, while in FIG. 7C, the wave propagating in the Y direction is reflected without leaking to the outside, and a stationary wave is generated.

As described above, since there are the first electrode finger 20a in which the wave propagating in the Y direction leaks to the outside at the predetermined frequency f and the second electrode finger 20b in which the wave propagating in the Y direction does not leak to the outside at the predetermined frequency f, the leakages of the waves propagating in the Y direction are averaged across the electrode fingers 20 aligned in the X direction. This is considered the reason why spurious is reduced in the first embodiment.

In FIG. 7A through FIG. 7C, described is an exemplary case where the anisotropy coefficient γ is positive and V1 is greater than V2. However, spurious is also reduced even when the anisotropy coefficient γ is positive and V1 is less than V2. This will be described with FIG. 8A through FIG. 9C. FIG. 8A through FIG. 9C are diagrams for describing how spurious is reduced in the acoustic wave resonator 100 of the first embodiment. FIG. 8A and FIG. 9A illustrate simulation results of wave distribution at a frequency at which spurious occurs. Black areas in the overlap region 26 correspond to the positions of antinodes, and white areas correspond to the positions of nodes. FIG. 8B and FIG. 8C illustrate the waveforms of waves propagating through a third electrode finger 20c and a fourth electrode finger 20d of the electrode fingers 20 at the first frequency f1, respectively. FIG. 9B and FIG. 9C illustrate the waveforms of waves propagating through the third electrode finger 20c and the fourth electrode finger 20d at the third frequency f3, respectively. The first frequency f1 and the third frequency f3 respectively correspond to the first frequency f1 and the third frequency f3 in FIG. 4A and FIG. 4B that have described how spurious becomes large in the first comparative example.

When the anisotropy coefficient γ is positive and V1 is greater than V2, the wave propagating in the Y direction is in a state where the wave has difficulty in leaking from the first region 32 to the outside. In such a state, as illustrated in FIG. 8B, FIG. 8C, FIG. 9B, and FIG. 9C, the antinode lies in the middle of the first region 32.

In this case, as illustrated in FIG. 8B, at the first frequency f1, in the third electrode finger 20c, the nodes lie at the ends of the third electrode finger 20c, and the wave propagating in the Y direction is reflected without leaking to the outside, and a stationary wave is generated. In contrast, as illustrated in FIG. 8C, in the fourth electrode finger 20d, since the position of the first region 32 in the Y direction differs from that of the third electrode finger 20c, at the first frequency f1, the node does not lie at the ends of the fourth electrode finger 20d, and the wave propagating in the Y direction leaks from the overlap region 26 to the outside.

In addition, as illustrated in FIG. 9B, at the third frequency f3, in the third electrode finger 20c, the node does not lie at the ends of the third electrode finger 20c, and the wave propagating in the Y direction leaks from the overlap region 26 to the outside. In contrast, as illustrated in FIG. 9C, at the third frequency f3, in the fourth electrode finger 20d, the nodes lie at the ends of the fourth electrode finger 20d, and the wave propagating in the Y direction is reflected without leaking to the outside, and a stationary wave is generated.

As described above, at the first frequency f1, there are the third electrode finger 20c in which the wave propagating in the Y direction does not leak to the outside and the fourth electrode finger 20d in which the wave propagating in the Y direction leaks to the outside. At the third frequency f3, there are the third electrode finger 20c at which the wave propagating in the Y direction leaks to the outside and the fourth electrode finger 20d at which the wave propagating in the Y direction does not leak to the outside. Thus, at the first frequency f1 and the third frequency f3, the leakages of the waves propagating in the Y direction to the outside are averaged across the electrode fingers 20 aligned in the X direction. Therefore, it is considered that spurious is reduced also in this case.

As described above, in the first embodiment, each of the electrode fingers 20 includes the first region 32 in which the velocity of the acoustic wave is the first velocity, and the second regions 34 that sandwich the first region 32 in the Y direction and in which the velocity of the acoustic wave is the second velocity different from the first velocity. The positions of the first regions 32 in the Y direction change with respect to the X direction. This configuration allows the leakages of the waves propagating in the Y direction to the outside to be averaged across the electrode fingers 20 aligned in the X direction, reducing spurious as described in FIG. 7A through FIG. 9C. In addition, since the overlap region 26 can keep its rectangular shape, the acoustic wave resonator 100 can be inhibited from increasing in size.

The first embodiment has described an exemplary case where the dielectric film 30 is made of an aluminum oxide film, but the dielectric film 30 may be made of other films. For example, the dielectric film 30 may be made of an aluminum nitride film, a silicon carbide film, or a tantalum oxide film. When the dielectric film 30 is made of an aluminum nitride film or a silicon carbide film, the velocity of the acoustic wave in the first region 32 becomes faster, while when the dielectric film 30 is made of a tantalum oxide film, the velocity of the acoustic wave in the first region 32 becomes slower. In addition, the first embodiment has described an exemplary case where the dielectric film 30 is located on the first region 32, but the dielectric film 30 may be located on the second region 34.

Figure 10A:
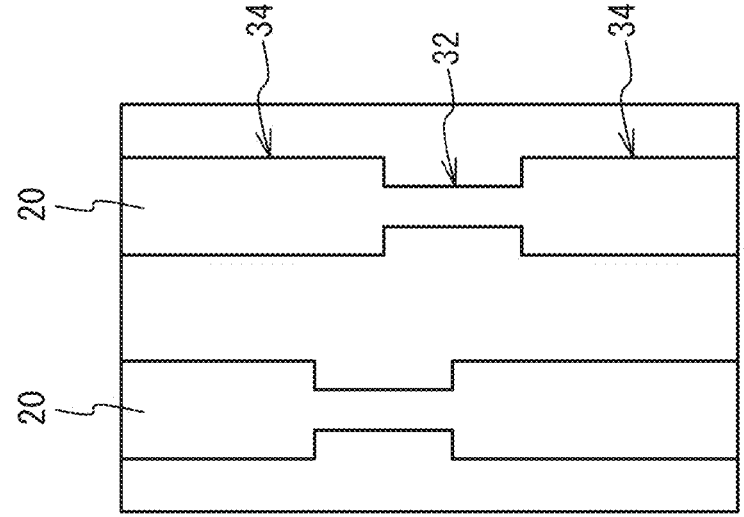
FIG. 10A and FIG. 10B are plan views illustrating a first technique for forming a first region and a second region between which a velocity of an acoustic wave therein differs.
Figure 10B:
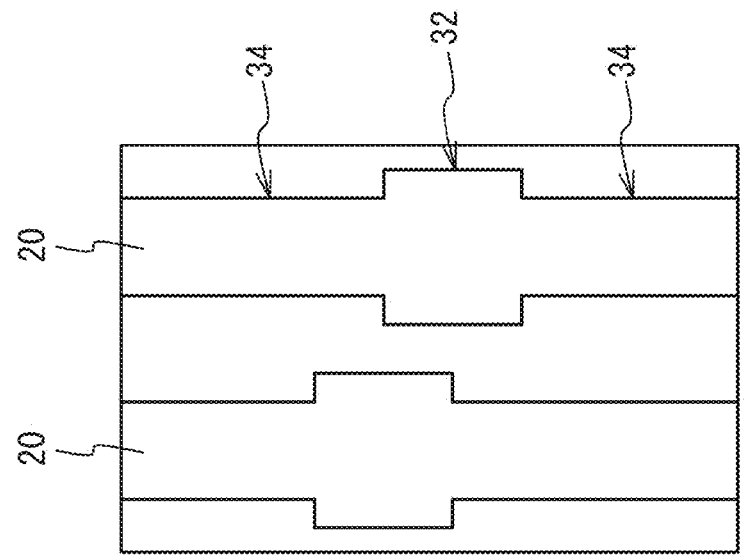

The first embodiment forms the first region 32 and the second region 34 between which the velocity of the acoustic wave therein differs by providing or not providing the dielectric film 30. However, the first region 32 and the second region 34 may be formed by other techniques. FIG. 10A and FIG. 10B are plan views illustrating a first technique for forming the first and second regions 32 and 34 between which the velocity of the acoustic wave therein differs. As illustrated in FIG. 10A and FIG. 10B, the first and second regions 32 and 34 between which the velocity of the acoustic wave therein differs may be formed by changing the width of each electrode finger 20. In the region where the width of the electrode finger 20 is wide, the velocity of the acoustic wave is less than that in a region where the width of the electrode finger 20 is narrow. It is only required that the width of the electrode finger 20 in the first region 32 differs from the width of the electrode finger 20 in the second region 34 by approximately −5% to 5%, and may differ by approximately 1% to 2%.

FIG. 11A through FIG. 11D illustrate a second technique for forming the first and second regions 32 and 34 between which the velocity of the acoustic wave therein differs. FIG. 11A and FIG. 11B are plan views, and FIG. 11C and FIG. 11D are cross-sectional views taken along line A-A in FIG. 11A and FIG. 11B, respectively. As illustrated in FIG. 11A through FIG. 11D, the first and second regions 32 and 34 between which the velocity of the acoustic wave therein differs may be formed by changing the thickness of each electrode finger 20. In the region where the electrode finger 20 is thick, the velocity of the acoustic wave is less than the velocity of the acoustic wave in a region where the electrode finger 20 is thin. It is only required that the thickness of the electrode finger 20 in the first region 32 differs from the thickness of the electrode finger 20 in the second region 34 by approximately −10% to 10%.

Figure 12A:
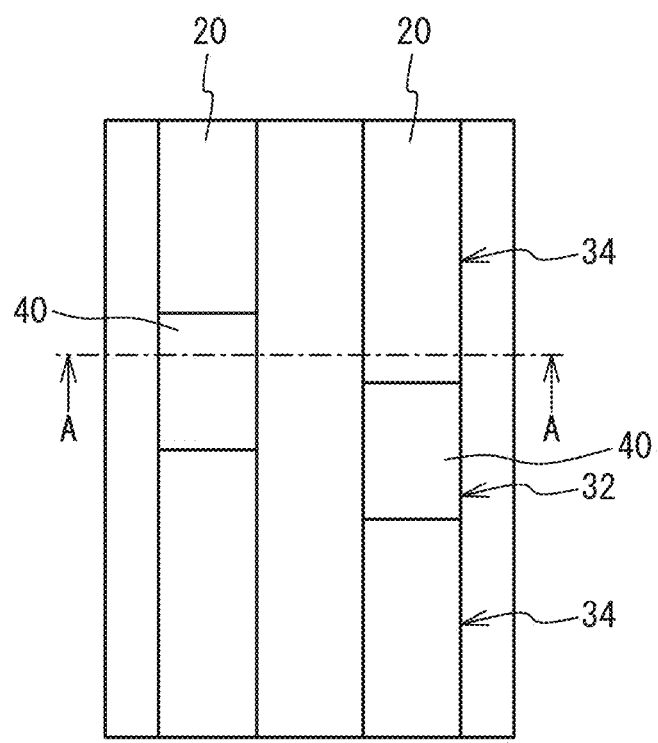
FIG. 12A and FIG. 12B illustrate a third technique for forming the first region and the second region between which the velocity of the acoustic wave therein differs.
Figure 12B:
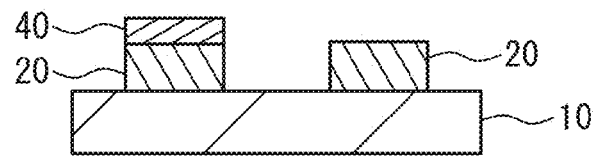

FIG. 12A and FIG. 12B illustrate a third technique for forming the first and second regions 32 and 34 between which the velocity of the acoustic wave therein differs. FIG. 12A is a plan view, and FIG. 12B is a cross-sectional view taken along line A-A in FIG. 12A. As illustrated in FIG. 12A and FIG. 12B, the first and second regions 32 and 34 between which the velocity of the acoustic wave therein differs may be formed by providing or not providing a dielectric film 40 on the upper surface of the electrode finger 20. The dielectric film 40 may be made of, for example, an aluminum oxide film, an aluminum nitride film, a silicon carbide film, a silicon oxide film, or a tantalum oxide film. When the dielectric film 40 is made of an aluminum oxide film, an aluminum nitride, a silicon carbide film, or a silicon oxide film, the velocity of the acoustic wave in the first region 32 in which the dielectric film 40 is located becomes faster. On the other hand, when the dielectric film 40 is made of a tantalum oxide film, the velocity of the acoustic wave in the first region 32 in which the dielectric film 40 is located becomes slower. In FIG. 12A and FIG. 12B, a region in which the dielectric film 40 is located is defined as the first region 32, and a region where the dielectric film 40 is not located is defined as the second region 34, but the same effect is achieved in the reverse case.

Figure 13A:
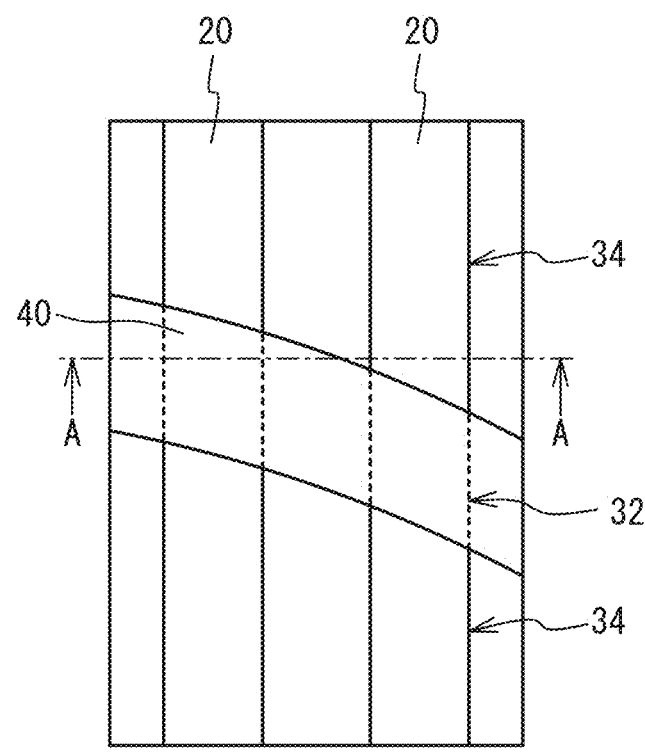
FIG. 13A and FIG. 13B illustrate a fourth technique for forming the first region and the second region between which the velocity of the acoustic wave therein differs.
Figure 13B:
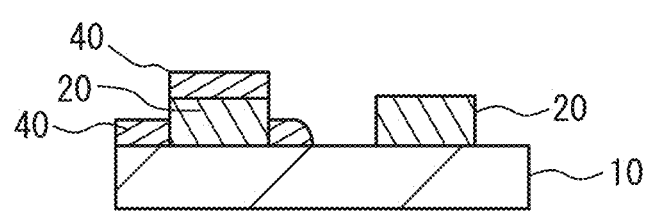

FIG. 13A and FIG. 13B illustrate a fourth technique for forming the first and second regions 32 and 34 between which the velocity of the acoustic wave therein differs. FIG. 13A is a plan view, and FIG. 13B is a cross-sectional view taken along line A-A in FIG. 13A. In FIG. 12A and FIG. 12B, the dielectric film 40 is located only on the electrode fingers 20. However, the dielectric film 40 may extend across the electrode fingers 20 as illustrated in FIG. 13A and FIG. 13B.

Figure 14A:
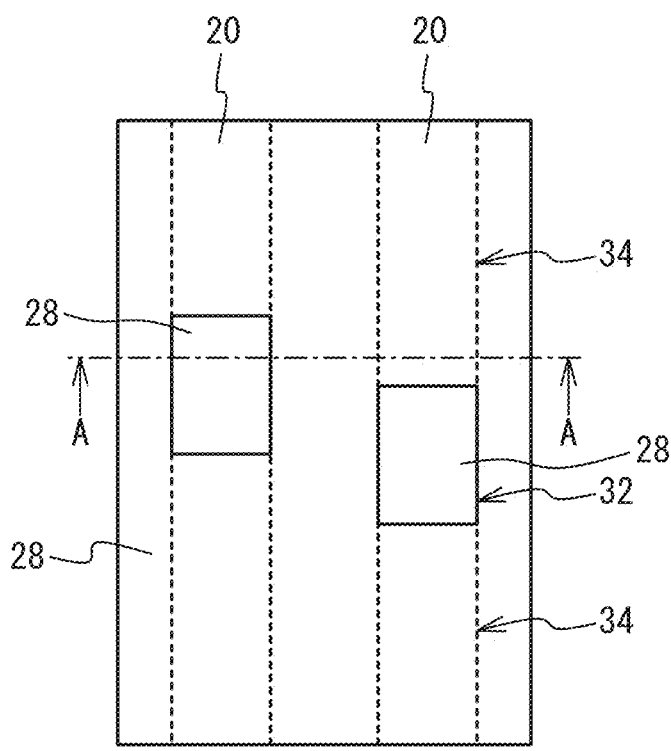
FIG. 14A and FIG. 14B illustrate a fifth technique for forming the first region and the second region between which the velocity of the acoustic wave therein differs.
Figure 14B:
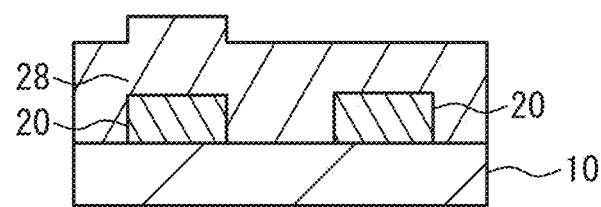

FIG. 14A and FIG. 14B illustrate a fifth technique for forming the first and second regions 32 and 34 between which the velocity of the acoustic wave therein differs. FIG. 14A is a plan view, and FIG. 14B is a cross-sectional view taken along line A-A in FIG. 14A. As illustrated in FIG. 14A and FIG. 14B, the first and second regions 32 and 34 between which the velocity of the acoustic wave therein differs may be formed by changing the thickness of the dielectric film 28 made of, for example, a silicon oxide film covering the electrode fingers 20.

Figure 15A:
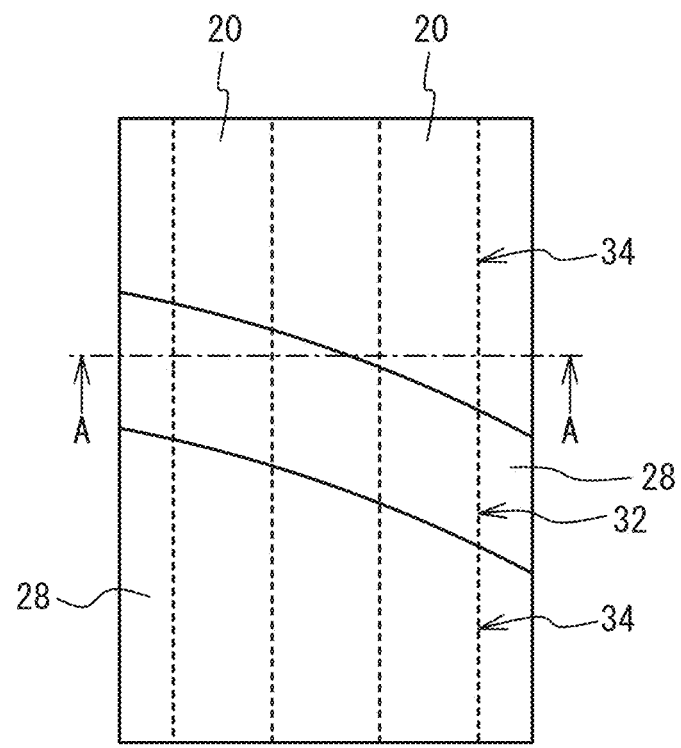
FIG. 15A and FIG. 15B illustrate a sixth technique for forming the first region and the second region between which the velocity of the acoustic wave therein differs.
Figure 15B:
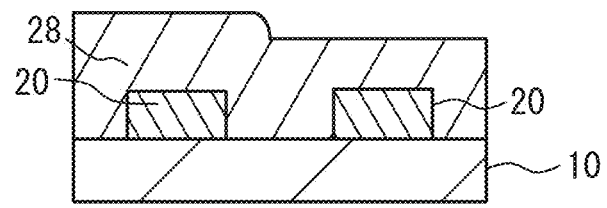

FIG. 15A and FIG. 15B illustrate a sixth technique for forming the first and second regions 32 and 34 between which the velocity of the acoustic wave therein differs. FIG. 15A is a plan view, and FIG. 15B is a cross-sectional view taken along line A-A in FIG. 15A. In FIG. 14A and FIG. 14B, the dielectric film 28 is thick only on the electrode fingers 20. However, the thick part of the dielectric film 28 may extend across the electrode fingers 20 as illustrated in FIG. 15A and FIG. 15B.

Figure 16A:
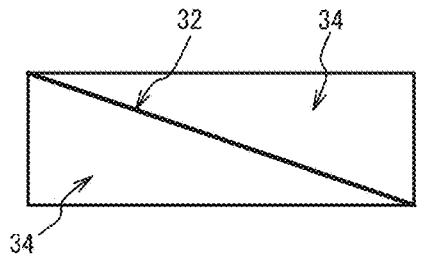
FIG. 16A through FIG. 16I are diagrams (No. 1) illustrating variations of positions of the first regions of electrode fingers in the Y direction in a pair of comb-shaped electrodes.
Figure 16B:
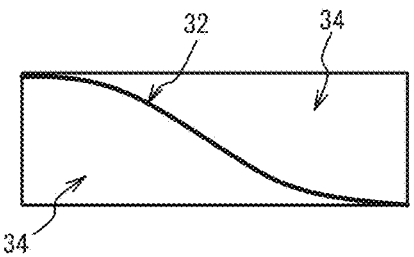
Figure 16C:
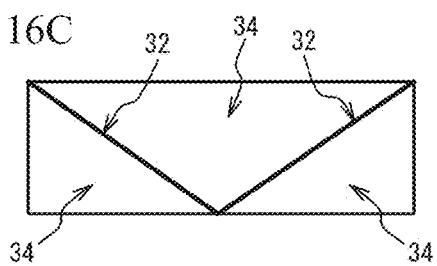
Figure 16D:
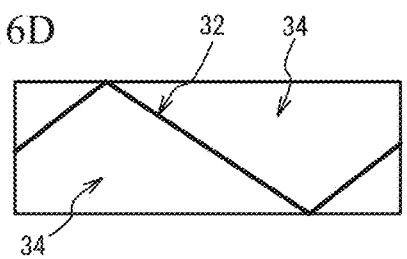
Figure 16E:
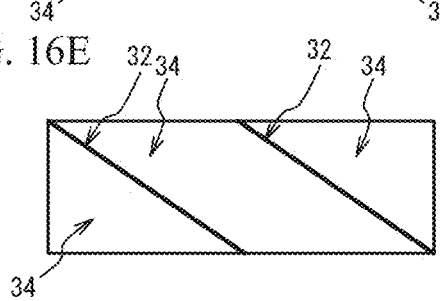

FIG. 16A through FIG. 17F illustrate variations of the positions of the first regions 32 of the electrode fingers 20 in the Y direction in the pair of comb-shaped electrodes 18. The positions of the first regions 32 of the electrode fingers 20 in the Y direction may linearly change with respect to the X direction as illustrated in FIG. 16A, may change in a curved line with respect to the X direction as illustrated in FIG. 16B, or may change so as to turn as illustrated in FIG. 16C. The curved line may have any shape. The number of turns is not limited to one, and may be plural as illustrated in FIG. 16D. The positions of the first regions 32 of the electrode fingers 20 in the Y direction may change in a single line with respect to the X direction, or may change in a plurality of lines as illustrated in FIG. 16E.

Figure 16F:
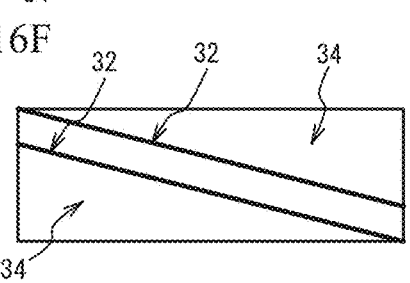
Figure 16G:
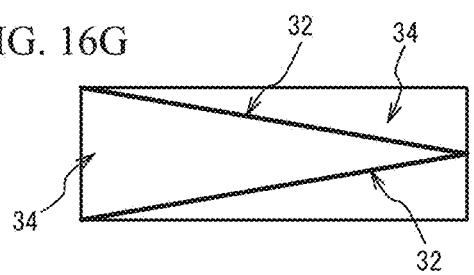
Figure 16H:
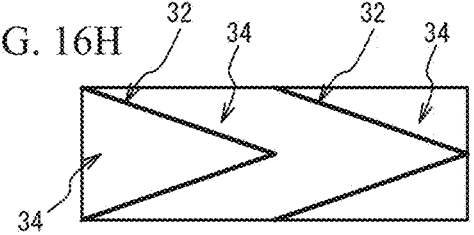
Figure 16I:
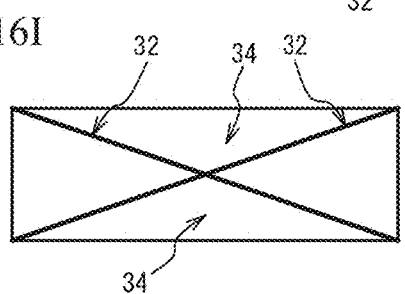
Figure 17A:
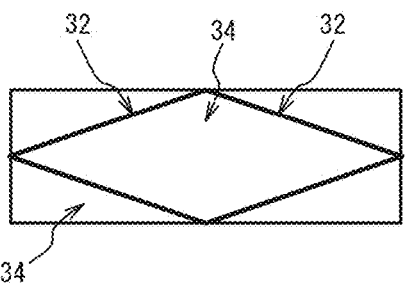
FIG. 17A through FIG. 17F are diagrams (No. 2) illustrating variations of positions of the first regions of the electrode fingers in the Y direction in a pair of comb-shaped electrodes.
Figure 17B:
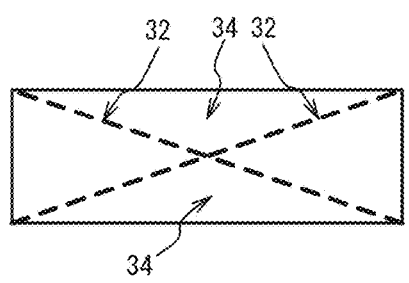
Figure 17C:
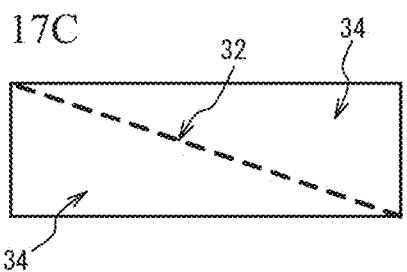
Figure 17D:
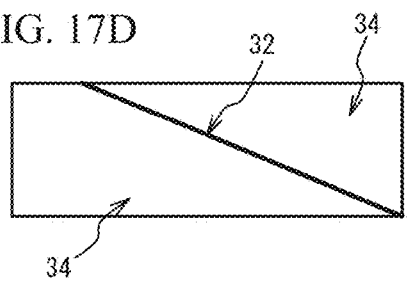
Figure 17E:
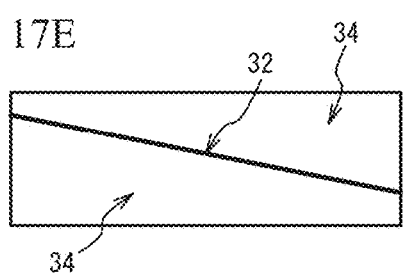
Figure 17F:
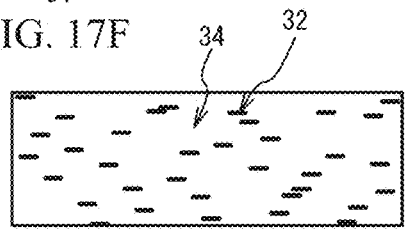

As illustrated in FIG. 16F, a plurality of first regions 32 may be located in one electrode finger 20, and the positions of the plurality of first regions 32 in the Y direction may linearly change in parallel with respect to the X direction, or may linearly change without being in parallel as illustrated in FIG. 16G through FIG. 17A. As illustrated in FIG. 17B and FIG. 17C, the first regions 32 may not be necessarily formed in all the electrode fingers 20, and may be formed in every second or more electrode finger 20. The first regions 32 may not be necessarily formed in all the electrode fingers 20 aligned in the X direction as illustrated in FIG. 17D, and the first regions 32 may not be necessarily formed so as to completely cross the region in the Y direction as illustrated in FIG. 17E. As illustrated in FIG. 17F, the positions of the first regions 32 in the Y direction may randomly change with respect to the X direction. The positions of the first regions 32 in the Y direction may not necessarily change with respect to the X direction in a part.

Second Embodiment

Figure 18:
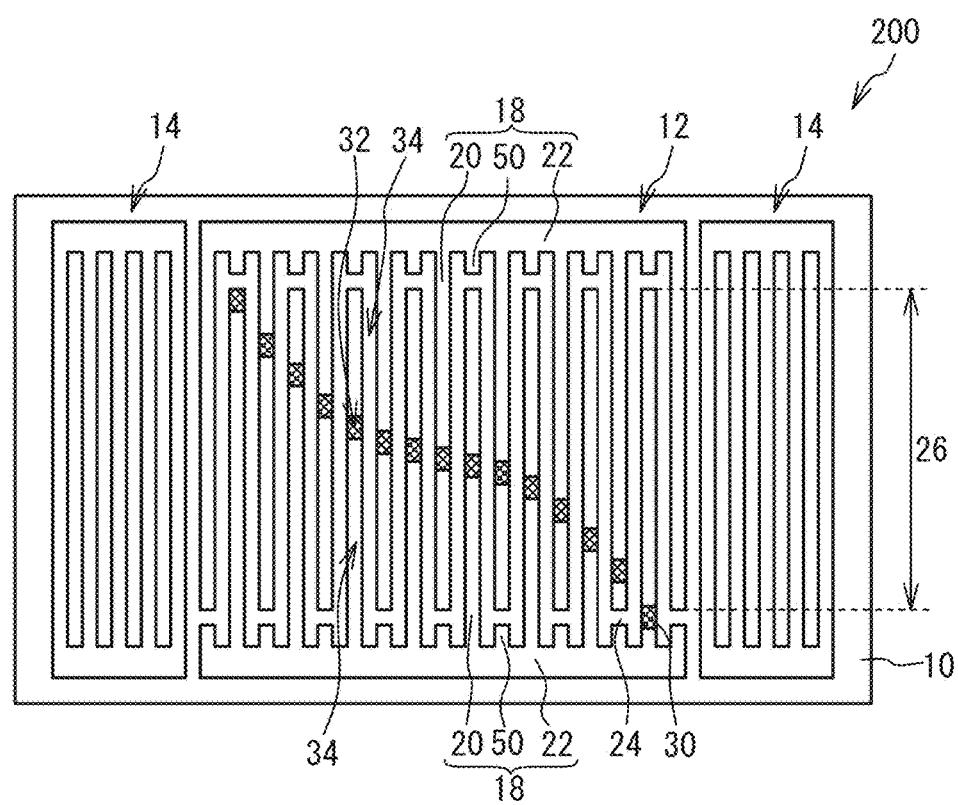
FIG. 18 is a plan view of an acoustic wave resonator in accordance with a second embodiment.

FIG. 18 is a plan view of an acoustic wave resonator 200 in accordance with a second embodiment. As illustrated in FIG. 18, in the acoustic wave resonator 200 of the second embodiment, each of the pair of comb-shaped electrodes 18 includes a plurality of dummy electrode fingers 50 of which first ends are coupled to the bus bar electrode 22, and of which second ends face the tips of the electrode fingers 20 of the other of the comb-shaped electrodes 18. The region between each of the tips of the electrode fingers 20 and the tip of the corresponding dummy electrode finger 50 of the dummy electrode fingers 50 is the gap region 24. Other configurations are the same as those of the first embodiment, and thus the description thereof is omitted.

As in the acoustic wave resonator 200 of the second embodiment, the dummy electrode fingers 50 of which the tips face the tips of the electrode fingers 20 may be located.

Third Embodiment

Figure 19:
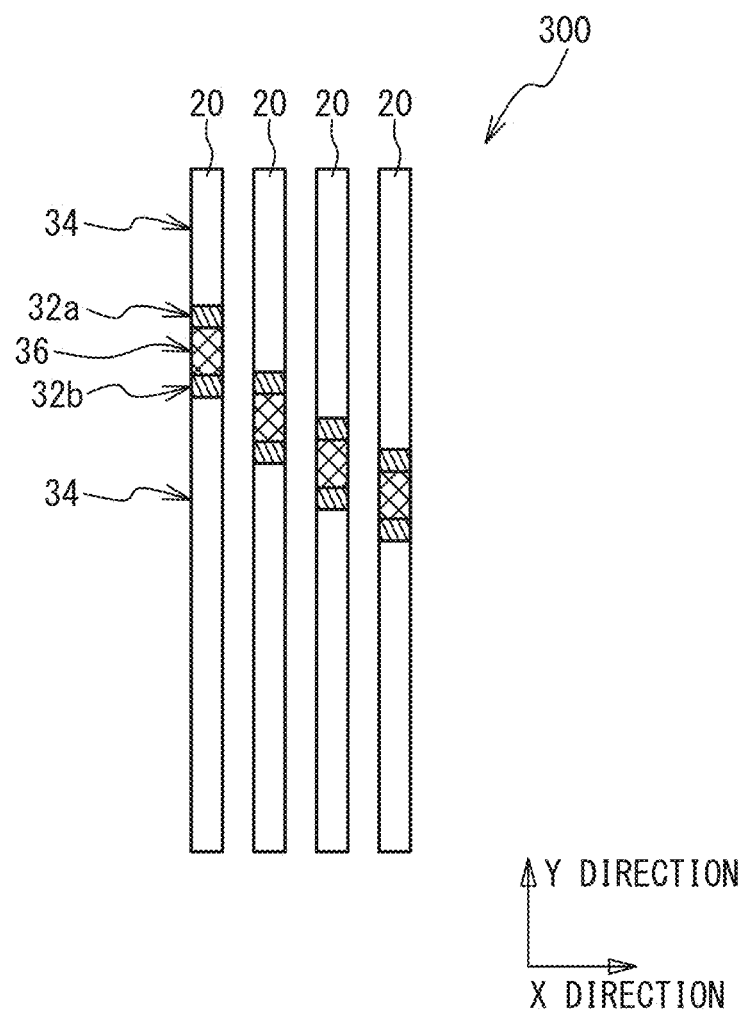
FIG. 19 is a plan view of a part in an overlap region of an acoustic wave resonator in accordance with a third embodiment.

FIG. 19 is a plan view of a part of an acoustic wave resonator 300 in accordance with a third embodiment in the overlap region 26. As illustrated in FIG. 19, in the acoustic wave resonator 300 of the third embodiment, the electrode finger 20 includes two first regions 32a and 32b. The second regions 34 are located further out than the first regions 32a and 32b in the Y direction. A region between the first regions 32a and 32b is a third region 36 in which the velocity of the acoustic wave is a third velocity different from the first velocity and the second velocity. Other configurations are the same as those of the first embodiment, and thus the description thereof is omitted.

In the third embodiment, each of the electrode fingers 20 includes the first regions 32a and 32b located away from each other in the Y direction, the second regions 34 located so as to sandwich the first regions 32a and 32b in the Y direction, and the third region 36 located between the first regions 32a and 32b. The velocity of the acoustic wave in the third region 36 (the third velocity) differs from the velocities of the acoustic wave in the first regions 32a and 32b and the second region 34 (the first velocity and the second velocity). This configuration allows the acoustic wave resonator with different resonance characteristics to be obtained.

Fourth Embodiment

Figure 20:
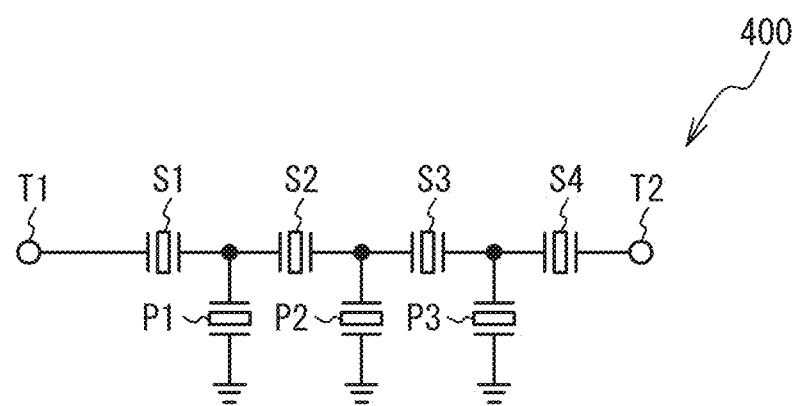
FIG. 20 illustrates a filter in accordance with a fourth embodiment.

FIG. 20 illustrates a filter 400 in accordance with a fourth embodiment. As illustrated in FIG. 20, the filter 400 of the fourth embodiment is a ladder-type filter that includes one or more series resonators S1 through S4 connected in series and one or more parallel resonators P1 through P3 connected in parallel between an input/output terminals T1 and T2. At least one of the series resonators S1 through S4 or the parallel resonators P1 through P3 may be the acoustic wave resonator according to any one of the first through third embodiments. The filter is not limited to a ladder-type filter, and may be other filter such as a lattice-type filter.

Fifth Embodiment

Figure 21:
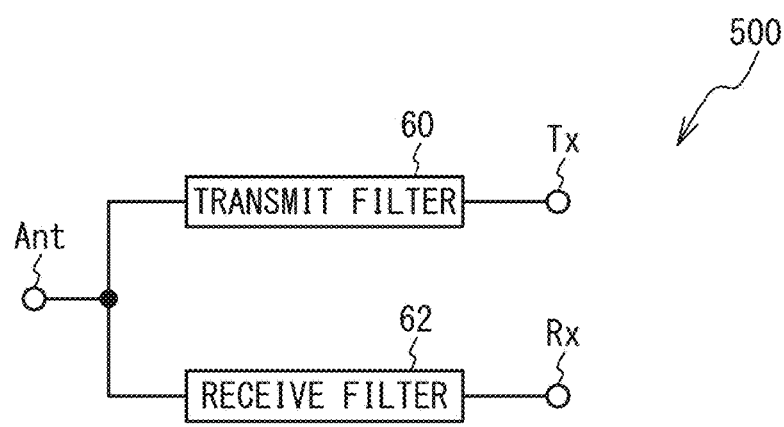
FIG. 21 illustrates a duplexer in accordance with a fifth embodiment.

FIG. 21 illustrates a duplexer 500 in accordance with a fifth embodiment. As illustrated in FIG. 21, the duplexer 500 of the fifth embodiment includes a transmit filter 60 connected between an antenna terminal Ant and a transmit terminal Tx and a receive filter 62 connected between the antenna terminal Ant and a receive terminal Rx. The transmit filter 60 and the receive filter 62 have different passbands. The transmit filter 60 transmits signals in the transmit band to the antenna terminal Ant as transmission signals among signals input from the transmit terminal Tx, and suppresses signals in other bands. The receive filter 62 transmits signals in the receive band to the receive terminal Rx as reception signals among signals input from the antenna terminal Ant, and suppresses signals in other band. At least one of the transmit filter 60 or the receive filter 62 may be the filter described in the fourth embodiment.

Although the embodiments of the present invention have been described in detail, it is to be understood that the various change, substitutions, and alterations could be made hereto without departing from the spirit and scope of the invention.

What is claimed is:

1. An acoustic wave resonator comprising:
   a piezoelectric substrate;
   a pair of comb-shaped electrodes located on the piezoelectric substrate, each of the pair of comb-shaped electrodes including a plurality of electrode fingers exciting a surface acoustic wave and a bus bar electrode to which the plurality of electrode fingers are connected, the plurality of electrode fingers having the same length, the pair of comb-shaped electrodes forming an overlap region in which the plurality of electrode fingers of one of the pair of comb-shaped electrodes and the plurality of electrode fingers of another of the pair of comb-shaped electrodes overlap,
   wherein each of the plurality of electrode fingers overlapping in the pair of comb-shaped electrodes includes:
   a first region that is located in the overlap region, in which a velocity of the surface acoustic wave is a first velocity, and of which a position in a first direction in which the plurality of electrode fingers extend changes with respect to a second direction intersecting the first direction; and
   second regions that are located in the overlap region, in which a velocity of the surface acoustic wave is a second velocity different from the first velocity, and that sandwich the first region in the first direction,
   wherein a length of at least one of the second regions in the first direction is longer than a length of the first region in the first direction.

2. The acoustic wave resonator according to claim 1, wherein
   in the pair of comb-shaped electrodes, the positions of the first regions of the plurality of electrode fingers in the first direction linearly change with respect to the second direction.

3. The acoustic wave resonator according to claim 1, wherein
   in the pair of comb-shaped electrodes, the positions of the first regions of the plurality of electrode fingers in the first direction randomly change with respect the second direction.

4. The acoustic wave resonator according to claim 1, wherein
   at least one of the pair of comb-shaped electrodes further includes, in the overlap region, another electrode finger formed of a fourth region in which a velocity of the surface acoustic wave is the second velocity.

5. The acoustic wave resonator according to claim 1, wherein
each of the pair of comb-shaped electrodes includes a plurality of dummy electrode fingers of which first ends are coupled to the bus bar electrode, and of which second ends face tips of the plurality of electrode fingers of another of the pair of comb-shaped electrodes.

6. The acoustic wave resonator according to claim 1, further comprising:
a dielectric film located so as to cover the plurality of electrode fingers of the pair of comb-shaped electrodes and mainly composed of silicon oxide.

7. The acoustic wave resonator according to claim 6, further comprising:
another dielectric film on the dielectric film located on one of the first region and the second region,
wherein the another dielectric film is not located on the dielectric film located on another of the first region and the second region.

8. The acoustic wave resonator according to claim 6, wherein
a thickness of the dielectric film located on the first region differs from a thickness of the dielectric film located on the second region.

9. The acoustic wave resonator according to claim 1, wherein
widths of the plurality of electrode fingers of the pair of comb-shaped electrodes in the first region differ from widths of the plurality of electrode fingers of the pair of comb-shaped electrodes in the second region.

10. The acoustic wave resonator according to claim 1, wherein
thicknesses of the plurality of electrode fingers of the pair of comb-shaped electrodes in the first region differ from thicknesses of the plurality of electrode fingers of the pair of comb-shaped electrodes in the second region.

11. The acoustic wave resonator according to claim 1, further comprising:
a dielectric film located on the plurality of electrode fingers of the pair of comb-shaped electrodes and on one of the first region and the second region,
wherein the dielectric film is not located on another of the first region and the second region.

12. A filter comprising the acoustic wave resonator according to claim 1.

13. The acoustic wave resonator according to claim 1, wherein the first region in each of the plurality of electrode fingers of the pair of comb-shaped electrodes is a single first region.

14. The acoustic wave resonator according to claim 1, further comprising:
reflectors located on both sides of the pair of comb-shaped electrodes and reflecting the surface acoustic wave.

15. An acoustic wave resonator comprising:
a piezoelectric substrate;
a pair of comb-shaped electrodes located on the piezoelectric substrate, each of the pair of comb-shaped electrodes including a plurality of electrode fingers exciting an acoustic wave and a bus bar electrode to which the plurality of electrode fingers are connected, the pair of comb-shaped electrodes forming an overlap region in which the plurality of electrode fingers of one of the pair of comb-shaped electrodes and the plurality of electrode fingers of another of the pair of comb-shaped electrodes overlap,
wherein each of the plurality of electrode fingers overlapping in the pair of comb-shaped electrodes includes:
a first region that is located in the overlap region, in which a velocity of the acoustic wave is a first velocity, and of which a position in a first direction in which the plurality of electrode fingers extend changes with respect to a second direction intersecting the first direction;
second regions that are located in the overlap region, in which a velocity of the acoustic wave is a second velocity different from the first velocity, and that sandwich the first region in the first direction; and
wherein the pair of comb-shaped electrodes includes, in the plurality of electrode fingers in the overlap region, a plurality of the first regions located away from each other in the first direction, the second regions sandwiching the plurality of the first regions in the first direction, and a third region that is located between the plurality of the first regions and in which a velocity of the acoustic wave is a third velocity different from the first velocity and the second velocity.

16. A duplexer comprising:
a transmit filter; and
a receive filter,
wherein at least one of the transmit filter or the receive filter is a filter including an acoustic wave resonator, and
the acoustic wave resonator includes:
a piezoelectric substrate;
a pair of comb-shaped electrodes located on the piezoelectric substrate, each of the pair of comb-shaped electrodes including a plurality of electrode fingers exciting a surface acoustic wave and a bus bar electrode to which the plurality of electrode fingers are connected, the plurality of electrode fingers having the same length, the pair of comb-shaped electrodes forming an overlap region in which the plurality of electrode fingers of one of the pair of comb-shaped electrodes and the plurality of electrode fingers of another of the pair of comb-shaped electrodes overlap,
wherein each of the plurality of electrode fingers overlapping in the pair of comb-shaped electrodes includes:
a first region that is located in the overlap region, in which a velocity of the surface acoustic wave is a first velocity, and of which a position in a first direction in which the plurality of electrode fingers extend changes with respect to a second direction intersecting the first direction; and
second regions that are located in the overlap region, in which a velocity of the surface acoustic wave is a second velocity different from the first velocity, and that sandwich the first region in the first direction,
wherein a length of at least one of the second regions in the first direction is longer than a length of the first region in the first direction.

* * * * *